United States Patent [19]

Cholin

[11] 4,224,538
[45] Sep. 23, 1980

[54] SERIES SUPERVISION/PARALLEL ACTUATION DEVICE

[75] Inventor: John M. Cholin, Hackensack, N.J.

[73] Assignee: Firetek Corporation, Hawthorne, N.J.

[21] Appl. No.: 942,541

[22] Filed: Sep. 15, 1978

[51] Int. Cl.² ............................ H03K 17/74; H02H 3/00
[52] U.S. Cl. ................................. 307/317 R; 169/61; 307/253; 361/245; 307/241
[58] Field of Search ...................... 169/61, 28; 361/87, 361/245; 307/56, 317 R, 253

[56] References Cited

U.S. PATENT DOCUMENTS

| | | | |
|---|---|---|---|
| 3,843,907 | 10/1974 | Genuit et al. | 361/87 |
| 3,952,809 | 4/1976 | Osborne | 169/61 |

*Primary Examiner*—Stanley D. Miller, Jr.
*Assistant Examiner*—B. P. Davis

[57] ABSTRACT

An electronic switch for use in alarm circuits in which line polarity is reversed in the actuation mode such that the electrical continuity of the circuit and the loads in the circuit may be supervised in series and upon polarity reversal the loads may be actuated in parallel. A first embodiment for Class B circuits uses three diodes to steer a current flow from the positive line to the load and back again supervising each load and a field loop in series. Upon polarity reversal, the diodes steer full terminal voltage to each load in the loop. A second embodiment for Class A circuits utilizes a transistor to short out one diode so that current may flow in either direction along one line in the event of a break in that line.

2 Claims, 4 Drawing Figures

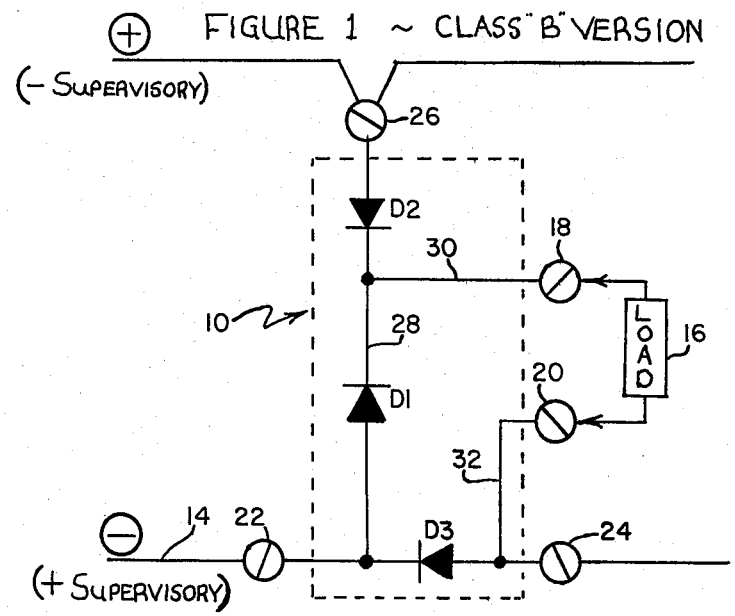
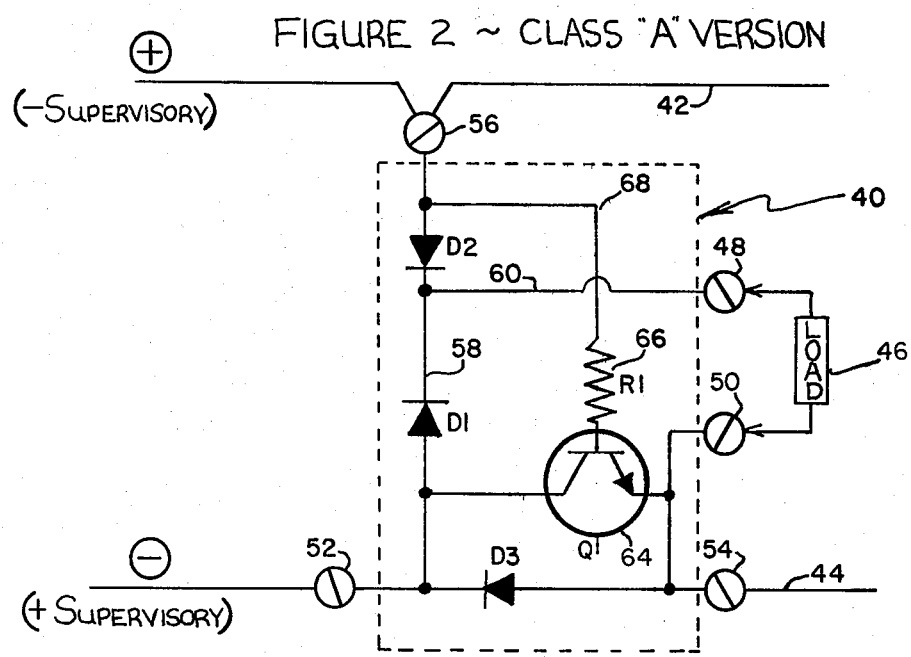

SERIES SUPERVISION/PARALLEL ACTUATION DEVICE

BACKGROUND OF THE INVENTION

1. Field of the Invention

This invention pertains to electronic switching devices and, in particular, switching devices responsive to a signal which indicates that a circuit having a plurality of loads should be switched from series to parallel operation.

2. Description of the Prior Art

The device of this invention was designed specifically to solve a problem in electrically controlled fire extinguishing systems but as presented in this application it can be used with any system in which electromechanical or electrochemical devices must be actuated in response to a signal, such as an alarm signal, and in which safety requires that the system must work without failure. For purposes of discussion, a fire extinguishing system will be used as an example only.

In a fire extinguishing system the ultimate goal is to insure that the fire extinguishing agent gets out of its container and onto the fire in response to an alarm. Two devices are commonly used to activate extinguishers in response to an electrical signal. One of these devices is basically a solenoid which is slow in operation and requires high electrical energy for actuation. The other is a squib, which is basically a detonator which is fast to actuate and requires low electrical energy. The squib, like the solenoid, has an electrical coil which must be continuous. In an automatically controlled electrical alarm and extinguishing system, the continuity of the coils in the solenoids or squibs of each extinguishing unit is tested by a supervisory current. The squib, in particular, presents problems because it requires a very low current for actuation. Squibs must be absolutely uniform when connected in series and are, therefore, very expensive.

The device of this invention is particularly useful in systems using squibs. The squib is basically a blasting cap which is used to upset the pressure differential on a pressure differential extinguishing system valve. When a detection system generates an alarm signal which the control system processes into an extinguishing decision, an electrical potential is applied to the squibs to release the extinguishing agent into the hazard area to put out the fire. Squibs are generally connected in series such that the current which passes through one squib must pass through all the others in the circuit. Under the supervisory mode of operation this is ideal. A small supervisory current, which is not enough to detonate the squibs, is passed through each squib and returns to the control unit. The control unit looks for the presence of the supervisory current to determine whether or not the electrical continuity of the circuit has been maintained. If the supervisory current stops, the electrical continuity has been interrupted and a trouble signal is given. In the alarm mode of operation, however, when the squibs are connected in series, the current which passes through the first squib must also pass through all the other squibs in the circuit. This causes the voltage to be reduced when applied to each squib. If there are three squibs in a circuit, each one receives one-third the voltage, but they all receive the same current. Consequently, each squib must be carefully matched so that each squib detonates as a result of exactly the same amount of energy applied to the squib. If there is a deviation, the first squib to detonate would also be the last one to detonate. The precise matching of squibs has been a problem for many reasons. The nitro-cellulose gunpowder in squibs tends to deteriorate over time, but not at a continuous rate. The squibs must be continually replaced periodically to minimize this condition. Disposal of old squibs must be done in a safe manner. One solution to the squib problem is to wire them in parallel. However, this system has a flaw in that the circuit can no longer supervise the continuity of the coils or filaments in the squibs. A supervisory current would only indicate the presence or absence of wiring continuity to the end-of-line resistive device and returning to the control panel. In an alarm state, the polarity would be reversed and the current would flow through each squib. However, such a system depends on the electrical continuity of the squib. The filaments or coils of a squib are very sensitive to environmental factors such as shock, vibration the thermal cycling.

The series supervision/parallel actuation device of the present invention is an answer to this problem. It allows all the squib filaments to be supervised in series so that the control system knows their condition at all times and whether or not the wiring is intact. In the alarm state this device drives all the squibs in parallel. Each equib will receive all the current which it requires at full terminal voltage. If one squib is slower to react than the others, this factor is immaterial. This is an advance over the prior state of the art in which the system had to choose between getting all the squibs to detonate and not supervising each one (in which case it would not know which squib had failed) or supervising all the squibs but not being able to guarantee that all of them would detonate.

A similar problem exists for systems using solenoid type valves, which are typically wired in parallel. Using an end-of-line resistance device, the system has no way of knowing if each solenoid coil does in fact have electrical continuity. The system can only supervise for the electrical continuity of the wiring going out to the end-of-line device and back. Consequently, in prior extinguishing systems it has often been necessary to supply different and discrete circuits for each solenoid to be actuated. This increases the cost and complexity of the control equipment significantly because each circuit has to be independently fused, supervised and monitored. With the series supervision/parallel actuation device of this invention, a single circuit can be used to drive any number of solenoid actuated devices and the operator would be assured that should there be a break in the solenoid coils or the circuitry driving these coils, a supervisory indication of trouble would appear at the control panel.

Two prior U.S. patents are directed to other solutions of the problems discussed above. U.S. Pat. No. 3,952,809 discloses a series to parallel transfer circuit for initiator firing but requires one switch connected between each of the junctions between each pair of series connected activators and the power supply means. In the system of this patent, two wires for each switch have to be run from the control box to the switch for each suppressor initiator. This wiring is beyond that normally needed for the field loop. In the present invention, no additional wiring is required. U.S. Pat. No. 4,013,128 discloses a modular fire protection circuit in which some suppression units are activated in response to the activation of other suppression units. This system is also more complex than that of the present invention.

SUMMARY OF THE INVENTION

This invention pertains to a series supervision/parallel actuation device for automatic electrically controlled fire extinguishing systems. The device is an electronic switch which is implemented into a parallel actuation loop and allows the actuation loop to supervise in series all of the loads in the circuit, but upon polarity reversal for actuation allows all of the loads to be driven in parallel. As described in the preferred embodiment it is made from solid state components. This device requires no additional wiring beyond that which is normally used in an extinguishing circuit or actuation circuit. It has no moving parts. The device allows a supervisory current to pass through all of the loads as if they were wired in series. However, when the polarity reverses in response to an alarm signal, the device allows the current to pass through all of the loads as if the loads were wired in parallel. Thus, the device supervises the electrical continuity of all of the loads until the very moment that the alarm potential is applied to the circuit.

The series supervision/parallel actuation device is, in its simplest embodiment, an electronic switch using three diodes and connected to a load in a field wired loop. In the supervisory mode the negative line is positive with respect to the positive line. As current enters the device, it encounters a reverse-biased diode and a forward biased diode. It flows through the forward biased diode and comes to the junction of the third diode and the load. The third diode is reverse-biased, so the current flows through the load coil and back to the negative line, having by-passed a reverse-biased diode on that line. It then continues out to the next device in the loop, and repeats this path. Eventually it reaches an end-of-line-resistive device which supplies a current path back to a control panel. At this point the supervisory current is essentially negative. In the alarm state, when the control panel goes into alarm, the polarity of the wires in the field loop is reversed. The current flows along the positive line and goes through the second diode which is now forward biased. It will not flow through the first diode which is now reverse biased. Consequently, it flows again through the load but this time the current is great enough to actuate whatever mechanical or electro-mechanical or electro-chemical event that is supposed to happen inside the load. In the fire extinguishing systems discussed supra, the squib will be detonated because the current is very great. Each squib or solenoid or other load will be able to operate independently of the others because each load is receiving full terminal voltage across the supply rails. After the current flows through the load it then flows through the third diode and back to the control panel. This embodiment is an inexpensive and simple embodiment for Class B systems.

A second embodiment is slightly more complex and expensive and is for use with Class A systems in which the security of the circuitry is of utmost importance. A Class A circuit must operate despite a single break or a single ground fault. A ground fault does not affect either the Class A or the Class B embodiments of this device. However, the Class B version will not work with a Class A circuit because the third diode would be reversed biased for a return voltage. In a Class A circuit, when the system goes into the alarm state the potential will be applied to both ends of the loop, so that, if there is a single break, all of the initiator devices will still receive actuation voltage and the loop will still be able to conduct actuation current.

In a supervised actuation circuit for fire alarm purposes, generally actuation circuits reverse polarity from that of the supervisory mode of operation.

In the Class A version, a transistor and a resistor are added to the device. In the supervisory mode positive current flows to a first and third diode and to the transistor. Since the third diode is again reverse biased and the transistor is non-conductive to current in this direction, the current flows through the only open path which is the forward biased first diode. As it flows toward the second diode which again reverse biased, it is directed toward the load and the resistor. The resistor offers significantly greater resistance than the coil in the load and then out to the circuit loop on to the next device. If the load were to lose continuity, the amount of current flowing through the resistor to the transistor would be insufficient to keep the circuit out of the trouble state and a trouble signal would appear at the control unit. In the alarm state, the polarity is reversed, and current enters another path where it encounters the second diode, which is now forward-biased and the resistor leading to the transistor. Since the resistance of the resistor is great, most of the current will flow through the second diode. After this it meets the first diode which is now reverse-biased, so the current will flow through the load and down to the negative rail. From the negative rail, it can flow, either through the third diode which is now forward biased or to the next device in the other direction, depending on whether there has been a break in the wiring. If there were a break in the wiring to the next device in the loop, the current would have to flow back to the control panel. To solve this problem, the transistor is used to short out the third diode so current can pass in either direction. When alarm potential is applied across the loop, the resistor supplies current to the base of the transistor. This allows current to pass from the collector to the emitter, thus shorting out the third diode which is on the negative rail so that current can pass in either direction along the negative rail. In both embodiments, current from the load can flow in either direction along the negative rail. But in the Class A embodiment, the device becomes bi-directional on the negative supply rail. The current then can flow back to the control panel in either direction despite a break in the loop.

Both embodiments are similar, the only difference being the transistor in the Class A version which shunts out the third diode so that current can flow in either direction along the negative rail in the event of a break in the loop. Once the loop is in the alarm state, the third diode has done its job, which was to steer the supervisory current through the load. Hence, it has no function in the alarm state. Both embodiments use three steering diodes to effect a series supervisory circuit and, when the polarity is reversed to effect a superior parallel actuation circuit.

BRIEF DESCRIPTION OF THE DRAWINGS

FIG. 1 is a schematic drawing of the series supervision/parallel actuation device of the present invention in the embodiment for Class B circuits.

FIG. 2 is a schematic drawing of the series supervision/parallel actuation device of the present invention in the embodiment for Class A circuits.

DESCRIPTION OF THE PREFERRED EMBODIMENT

Figure 3:
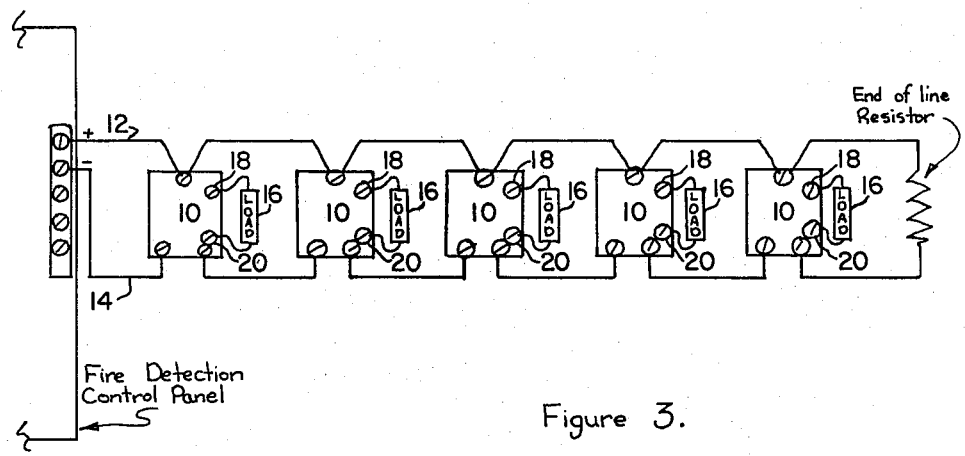
FIG. 3 is a diagrammatic representation of a Class P wiring loop including five of the devices of FIG. 1.

Referring now to the drawings and, in particular, to FIG. 1, the series supervision/parallel actuation device of the present invention for use in class B circuits is designated generally by the reference number 10. In FIG. 1 device 10 is shown as wired into a field loop in an electrically controlled alarm circuit. In a supervised actuation circuit for fire alarm purposes, polarity is generally reversed so that in the supervisory mode, one side of the circuit will have a polarity reversed from its polarity in the actuation mode. As illustrated in FIG. 1, the upper rail or wire 12 has a negative polarity in the supervisory mode and a positive polarity in the alarm mode, while the lower rail or wire 14 has a positive polarity in the supervisory mode and a negative polarity in the actuation mode. Device 10 is placed in the field loop such that rail 14 passes through device 10 through terminals 22, 24. A load 16 is connected to device 10 through terminals 18, 20. The other rail 12 is connected to device 10 through terminal 26.

Under the supervisory mode, which is the normal stand-by mode, rail 14 is positive with respect to rail 12. A positive current will enter device 10 through terminal 22 and its flow will be stopped by diode D3 in rail 14, because D3 is reverse-biased. Line 28, connecting that portion of rail 14 within device 10 to line 12 at terminal 26 contains diodes D1 and D2. Blocked by diode D3, the current will pass through D1 which is forward-biased until it reaches a junction of D2 and line 30 which goes to the load 16. Since D2 is reverse-biased, at this point the current will flow through line 30 and out through terminal 18 to the load 16. After the current passes through the load it returns to device 10 through terminal 20 and line 32 which is connected to rail 14 and continues to flow on through the loop, having by-passed D3. After the current passes through the last device 10 in the loop, it passes through an end-of-line resistor (not shown) which links rail 14 to rail 12. At this time, the supervisory current is essentially negative and it flows back to the control unit over rail 12. In the supervisory mode, the current flowing through device 10 and the load is very small (usually a fraction of a milliampere) and is used to supervise in series the electrical continuity of both the field loop and the loads connected to the field loop. A break in either will interrupt the current so that it fails to reach the control panel, thereby providing a trouble signal.

When the control panel goes into the alarm state, the field loop and device 10 operate in the alarm mode. The polarity of rails 12 and 14 is reversed. The current flows along rail 12 and enters device 10 through terminal 26, which is connected to line 28. The current passes through D2 which is now forward-biased and is stopped by D1 which is now reverse-biased. Again the current is steered over line 30 through terminal 18 to the load 16. In the alarm mode the current is large enough to actuate whatever mechanical, electro-mechanical or electro-chemical event that is supposed to happen within load 16. For example, it will detonate a squib initiator or activate a solenoid actuator for a fire extinguisher. Each load 16 in the field loop is able to operate independently of the others because in the alarm mode they are electrically connected and actuated in parallel. Each load 16 receives full terminal voltage across the power rails 12, 14. After the current flows through load 16, it re-enters device 10 though terminal 20 and flows over line 32 to rail 14 where it passes through diode D3, which is now forward-biased, and back to the control panel.

Referring now to FIG. 2, the series supervision/parallel actuation device of the present invention for use in Class A circuits (and also in Class B circuits) is designated generally by the reference number 40. In FIG. 2 device 40 is shown as wired into a field loop in an electrically controlled alarm circuit. The upper rail or wire 42 has a negative polarity in the supervisory mode and a positive polarity in the alarm mode. The lower rail or wire 44 has a positive polarity in the supervisory mode and a negative polarity in the alarm or actuation mode. Device 40 is placed in the field loop such that rail 44 passes through device 40 through terminals 52, 54. A load 46 is connected to device 40 through terminals 48, 50. The other rail 42 is connected to device 40 through terminal 56.

Device 40 is designed for Class A circuits in which security is of utmost importance and the circuit must operate despite a single break or a single ground fault. Both device 10 and device 40 will operate a spite of ground faults. However, device 10 will not operate with a break in the field loop under certain conditions. When a Class A circuit goes into the alarm state, the potential will be applied to both ends of the loop. If there is a single break all of the initiator devices will still receive full actuation voltage and be able to conduct actuation current. However, the Class B device will not be able to return the current to the control panel from one side of the break because D3 will still be reverse-biased in that direction. Device 40 solves this problem with the addition of a transistor to the device circuit to short out D3 when this problem arises.

Referring again to FIG. 2, the positive supervisory current enters device 40 through terminal 52. It cannot flow through D3 because D3 is reverse biased. Line 58, connecting that portion of rail 44 within device 10 to rail 42 at terminal 56 contains diodes D1 and D2. A transistor 64 is positioned within device 40 parallel to that portion of rail 44 within device 40 such that its collector is connected to line 58, its emitter is connected to line 62 and its base is connected through resistor R1 66 to line 58 at terminal 56. Blocked by D3, the current flows along line 58 past the junction with transistor 64, which is non-conductive in that direction, through forward biased D1 and is blocked by reverse-biased D2. The only available paths are through resistor 66 and the load 46 over line 60.

When a circuit incorporating device 40 goes into the alarm state, the polarity of rails 42 and 44 is reversed, rail 42 becoming positive. Alarm current then flows from rail 42 through terminal 56 and into device 40, where it encounters the resistor 66 and forward-biased D2. Since the resistance of resistor 66 is great, the majority of the current flows through D2 and is then blocked by D1 which is reverse biased. The majority of the current will flow down line 60 through load 46 and down to the now negative rail 44. From negative rail 44, the current can flow in either direction, since D3 is now forward biased, depending on whether there has been a break in the wiring in the loop. The problem arises if there is a break in the wiring to the left of one device 40 and current still has to flow back to the control panel. It cannot flow directly to the right along rail 44 because D3 is reverse-biased. Transistor 64 solves this problem. When alarm potential is applied across the loop, resistor 66 supplies current to the base of transistor 64, which then becomes conductive, allowing current to pass from its collector to its emitter. Consequently, transistor 64 shorts out D3 so that current can pass in either direction along negative rail 44. This has the effect of making device 40 bi-directional so that current can flow in either direction back to the control panel despite a break in the wiring. Once the circuit goes into the alarm state, D3 has no function, so shorting it out has no adverse effects.

Thus, device 40 performs the same function as device 10, but more effectively. Both devices supervise a field circuit in series both for continuity of the field wiring and electrical continuity in the loads, by going through each load coil in series with the same current. In the alarm state both devices 10 and 40 use the diodes as switches to switch the direction of the current to actuate the loads in parallel at full terminal voltage. Devices 10 and 40 require no additional wiring beyond that normally used in an actuation circuit. Devices 10 and 40 have an additional safety factor in that they supervise the electrical continuity of all of the loads until the very moment that the alarm potential is applied to the circuit.

FIG. 3 shows a Class B wiring loop having five devices 10, each connected to its respective load 16. The connections to the control panel and the end-of-line resistor are also shown.

Figure 4:
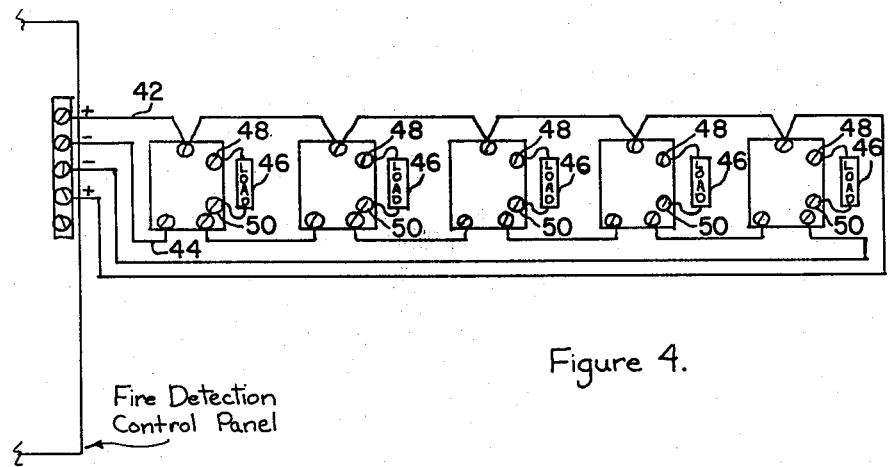
FIG. 4 is a diagrammatic representation of a Class wiring loop including five of the devices of FIG. 2.

FIG. 4 shows a Class A wiring loop having five devices 40, each connected to its respective load 46. The connections to the control panel are also shown.

From the previous discussion, it should be obvious that the quantity of five such devices 10 or 40 is not a limitation, but is merely illustrative.

I claim:

1. An electronic switch for the supervision in series and actuation in parallel of a plurality of electrically actuated mechanical, electro-mechanical and electro-chemical devices for use in a circuit loop in which line polarity is reversed upon recognition of an alarm signal for actuation of said devices comprising:

a first and a second line connecting said switch to a circuit loop;
a load connected to said switch;
a plurality of diodes within said switch to direct current to the load;
a first and a second of said diodes being connected in series between the two lines of said circuit such that one of said diodes is reverse-biased with respect to the other;
a junction between said first and second diodes connected to the first side of said load;
a third diode connected in the second line of said circuit;
said third diode being reverse-biased with respect to a positive current on said second line;
said diodes being positioned such that in a supervisory mode a positive current from the second line of said circuit flows through said first diode, is blocked by said second and third diodes, flows through said load and returns to said positive line to flow in series in the next switch and load, thus supervising the electrical continuity of said circuit loop and the loads on said loop;
said diodes being positioned such that upon polarity reversal in an actuation mode a positive current flows through the second of said diodes, is blocked by the first of said diodes flows through said load at full terminal voltage and then to and through the second line of said circuit including said third diode which is now forward-biased, thus actuating all of said loads in said circuit loop in parallel.

2. The electronic switch of claim 1 further comprising:

a transistor within said switch positioned such that its base is connected to the first of said lines through a resistor and before said second diode, its collector and its emitter are connected in parallel to said third diode;
said transistor being positioned such that upon polarity reversal in the actuation mode current passing through the load may flow along the second of said lines in either direction, thus shorting out said third diode which is reversed-biased in one direction.

* * * * *